United States Patent [19]

Miyazawa et al.

[11] Patent Number: 4,595,423

[45] Date of Patent: Jun. 17, 1986

[54] METHOD OF HOMOGENIZING A COMPOUND SEMICONDUCTOR CRYSTAL PRIOR TO IMPLANTATION

[75] Inventors: Shintaro Miyazawa, Isehara; Shigeo Murai, Osaka, both of Japan

[73] Assignees: Nippon Telegraph & Telephone Public Corporation, Tokyo; Sumitomo Electric Industries, Ltd., Osaka, both of Japan

[21] Appl. No.: 645,350

[22] Filed: Aug. 29, 1984

[30] Foreign Application Priority Data

Sep. 9, 1983 [JP] Japan .................... 58-165155

[51] Int. Cl.$^4$ .................. H01L 21/263; H01L 21/477
[52] U.S. Cl. .................... 148/1.5; 29/576 B; 29/576 T; 148/187; 148/189; 148/DIG. 84
[58] Field of Search .............. 148/1.5, 187, 189; 29/576 B, 576 T

[56] References Cited

U.S. PATENT DOCUMENTS

| | | | |
|---|---|---|---|
| 3,890,169 | 6/1975 | Schwartz et al. | 148/187 |
| 3,925,121 | 12/1975 | Touchy | 148/189 |
| 4,174,982 | 11/1979 | Immorlica, Jr. | 148/1.5 |
| 4,312,681 | 1/1982 | Rupprecht et al. | 148/1.5 |
| 4,357,180 | 11/1982 | Molnar | 148/1.5 |
| 4,421,577 | 12/1983 | Spicer | 148/187 |

FOREIGN PATENT DOCUMENTS 0056637  4/1980  Japan ..................... 148/1.5

OTHER PUBLICATIONS

Bhattacharya et al, J. Appl. Phys., 53(7), 1982, p. 4821.
Vaidyanathan et al, J. Electrochem. Soc., 124 (1977), 1781.
Cone et al, J. Appl. Phys., 54 (1983) 6346.
Kasahara et al, J. Appl. Phys., 50 (1979), 541.
Miyazawa et al, Appl. Phys. Letts., 44 (Feb. 1984), pp. 410–412.

Primary Examiner—Upendra Roy
Attorney, Agent, or Firm—Wenderoth, Lind & Ponack

[57] ABSTRACT

The quality of a compound semiconductor crystal such as gallium arsenide used for an integrated circuit is upgraded by a method comprising optionally forming a protective film on the obverse surface and reverse surface of a substrate consisting of a compound semiconductor crystal, subjecting the substrate to a heat treatment in an inert atmosphere at a temperature of at least the same as the activating temperature after the ion implantation into the substrate and then optionally revmoving the protective film.

14 Claims, 7 Drawing Figures

METHOD OF HOMOGENIZING A COMPOUND SEMICONDUCTOR CRYSTAL PRIOR TO IMPLANTATION

BACKGROUND OF THE INVENTION

1. Field of the Invention

This invention relates to a method of upgrading the quality of a compound semiconductor crystal exemplified typically by a semi-insulating gallium arsenide substrate crystal used for a gallium arsenide integrated circuit.

2. Description the Prior Art

In semi-insulating substrates crystals used for gallium arsenide integrated circuits, a crystal grown by the melt pulling method (LEC method) has crystal microdefects, i.e. dislocation density of generally ranging from $2-3 \times 10^4$ cm$^{-2}$ to $5 \times 10^5$ cm$^{-2}$ distributed unevenly in crystallographical (100) plane. Lately, it has been reported that the distribution of dislocations is related with the characters of a field effect transistor of gallium arsenide, in particular, the ununiformity of threshold voltage Vth to determine "ON-OFF" of swithcing (e.g. Miyazawa: "Oyo Butsuri (Applied Physics)" Vol. 52, N0. 3 (1983)). Thus, various efforts have been made to obtain crystals with a lowered dislocation density or uniform distribution of dislocation density by improving the temperature condition during growth thereof, but it has not been realized sufficiently to realize a uniform dislocation distribution.

Moreover, in LEC crystals, there are cellular dislocation networks of several hundred microns in diameter and it is found by cathodoluminescence that the crystalline quality near the cellular wall of the dislocation network is different from other regions (e.g. Chin et al: "J. Electrochem. Soc." Vol. 129, No. 10 (1982), page 2386-2388). The presence of this dislocation network leads also to occurrence of ununiform characters of a transistor. However, the dislocation network is incorporated or formed during the growth of a crystal and accordingly, it is difficult to eliminate the dislocation network.

As described above, the form of an arrangement of dislocation in an LEC crystal has influences upon the dynamic characteristic of a transistor and constitutes a bar to realization of an integrated circuit on a wafer. Of course, it has eagerly been desired to overcome this drawback, but the inventors do not know an effective prior method of making a uniform compound semiconductor crystal.

SUMMARY OF THE INVENTION

It is an object of the present invention to provide a method of upgrading the uniformity of a compound semiconductor crystal whereby the above described disadvantages of the prior art can be overcome.

It is another object of the present invention to provide a method of homogenizing a compound semiconductor crystal such as gallium arsenide (GaAs) by a heat treatment before ion implantation.

It is a further object of the present invention to provide a method of preparing a GaAs crystal with a uniform distribution of dislocations.

These objects can be attained by a method of making uniform a compound semiconductor crystal which comprises a step of forming a protective film on the obverse surface and reverse surface of a substrate consisting of a compound semiconductor crystal, a step of subjecting the substrate to a heat treatment at a temperature of at least the same as the activating temperature after ion implantation in an inert atmosphere and a step of, after the heat treatment, removing the protective film.

BRIEF DESCRIPTION OF THE DRAWINGS

The accompanying drawings illustrate the principle and merits of the present invention in greater detail.

DETAILED DESCRIPTION OF THE INVENTION

The inventors have made efforts to develop an effective method of upgrading or homogenizing the quality of a compound semiconductor crystal and consequently, have found that the compound semicondutor crystal can be homogenized or made uniform by optionally forming a protective film on the obverse and reverse surfaces of a substrate consisting of a compound semiconductor crystal, subjecting the substrate to a heat treatment at a temperature of at least the same as the activating temperature after ion implantation in an inert atmosphere, and optionally removing the protective film.

The protective film is optionally formed, for example, by the so-called plasma CVD method comprising flowing mixed gases of silane and ammonia between plate-shaped electrodes in a nitrogen atmosphere, applying high frequency between the electrodes to generate a plasma and placing a wafer in the plasma to coat it with Si$_3$N$_4$ film. The protective film has generally a thickness of 1100 to 1400 Å.

The heat treatment should be carried out at a temperature the same as or higher than that at which activation of the substrate is carried out after ion implantation thereof, but is preferably carried out at a temperature of 800° to 950° C. The inert atmosphere consists generally of N$_2$, He, Ar or a mixture of 5% H$_2$ and N$_2$.

One embodiment of the present invention will now be explained by the accompanying drawings. It will be obvious to those skilled in the art that various changes and modifications can be made without departing from the spirit of the present invention. Therefore, the present invention should not be construed as being limited to this embodiment.

FIGS. 1(a) to 1(d) are schematic views to illustrate the steps of making uniform a compound semiconductor crystal according to the present invention, in which substrate crystal 1 is subjected to coating of the obverse and reverse surfaces thereof with silicon nitride (SiN) film 2 as shown in 1(b), the coated crystal is subjected to heat treamtent in an electric furnace in an inert atmosphere and then removal of SiN film 2 as shown in 1(c), and of crystal surface 3 is polished as shown in 1(d). SiN film 2 used herein serves to protect the surface of substrate crystal 1 from release or evaporation of As. Other materials having a similar effect can of course be used, illustrative of which are SiO$_2$, SeN and the like.

The heat treatment is carried out at 800° C. for 6 to 24 hours in an electric furnace. After the heat treatment, it is found by observation of cathodoluminescence that the homogeneity of the crystal subjected to the steps (a) to (d) is markedly upgraded.

Figure 1A:
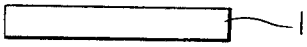
FIGS. 1(a) to 1(d) are schematic views to illustrate steps of making uniform a compound semiconductor crystal according to one embodiment of the present invention.
Figure 1B:
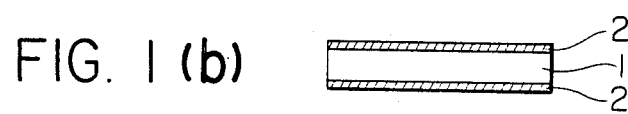
Figure 1C:
Figure 1D:
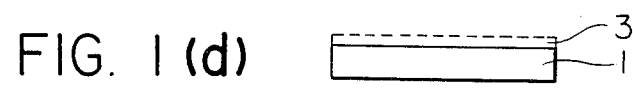
Figure 2:
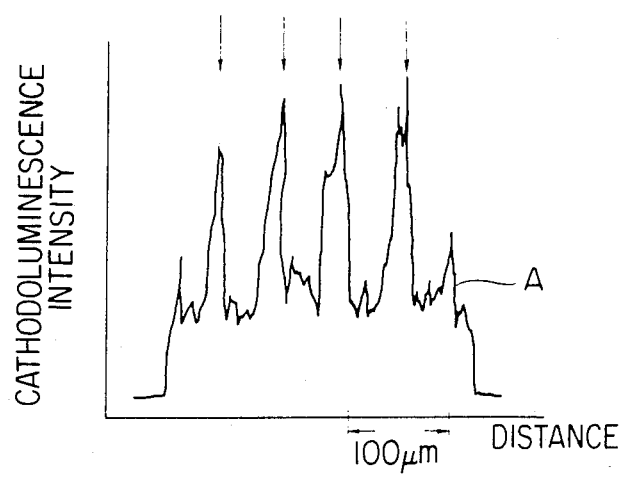
FIGS. 2(a) to 2(c) are graphs showing the cathodoluminescence intensity distribution of a crystal treated according to one embodiment of the present invention.
Figure 2:
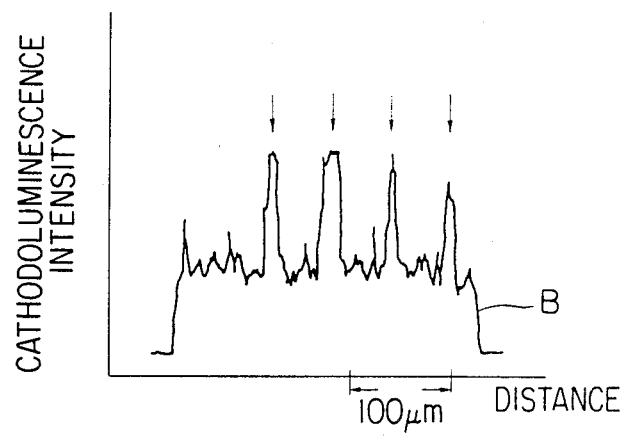
Figure 2:
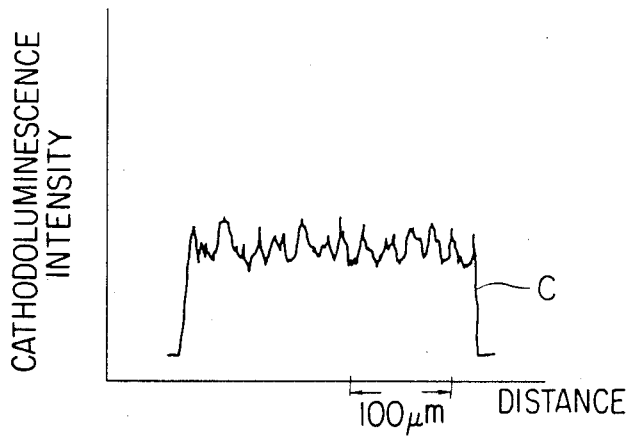

FIGS. 2(a) to 2(c) are graphs showing the luminescence intensity distributions obtained by scanning a luminescense with a wavelength of about 8600 Å along the surfaces of crystal (A) not subjected to the heat treatment, crystal (B) subjected to the heat treatment for 9 hours and crystal (C) subjected to the heat treatment for 15 hours, respectively. The local increases, as indicated by arrows, of the luminescence intensity found in the case of no heat treatment correspond to the above described cellular boundary of dislocation network, i.e. so-called denuded zone. This ununiform intensity distribution is somewhat decreased by the heat treatment for 9 hours and is substantially eliminated by the heat treatment for 15 hours. That is, it is evident from these results that the homogeneity of a compound semiconductor crystal is increased by the heat treatment of the present invention.

In this embodiment, the heat treatment temperature is adjusted to 800° C., since when an ion implantation is carried out to form an integrated circuit, a heat treatment for activating the implanted ion is ordinarily carried out at 800° C. Thus, it is desirable that the heat treatment temperature is higher than the temperature of such a heat treatment for the activation and obviously, the higher the temperature, the shorter the heat treatment time. In the heat treatment at 850° C., for example, there is not found the above described local luminescence intensity in a heat treatment time of about 10 hours. Since the heat treatment time depends upon the heat treatment temperature as set forth above, the present invention does not intend to particularly specify the heat treatment time and temperature, but is only characterized by carrying out the heat treatment at a temperature of the same as or higher than the annealing temperature for the activation of implanted ions.

In step (d) of FIG. 1, there is the possibility of a slight dissociation of As from the crystal surface by the heat treatment at a high temperature for a long period of time, and thus, the electrical properties of the crystal surface and deteriorated so that it is necessary to remove a thickness of at least 10 μm therefrom. When the so-called leakage current is measured by the two-terminal method after the SiN film is removed after the heat treatment, it amounts to more than 10 μA while it is in a range of 1-4 μA before the heat treatment. However, it is found by measurement of the leakage current after surface-polishing repeatedly that it is several μA with a removed thickness of about 10 μm and the semi-insulation is held.

In the above described embodiment, an SiN film is used as a protective film of the crystal, but the heat treatment can be carried out in a glass such as $B_2O_3$ or in an As atmosphere without using such a protective film. What is essential for the present invention is that a heat treatment is carried out before ion implantation at a temperature of the same as or higher than the heat treatment temperature of the activation of the implanted ion, and the thus obtained meritorious effects are as described above.

The scope and novelty of the present invention are not intended to be limited by the above described method and apparatus for the heat treatment. The foregoing illustration is limited to gallium arsenide as a composed semiconductor crystal, but of course, the present invention can be applied to other compound semiconductor crystals such as gallium phosphide, indium phosphide, indium arsenide and the like with a similar homogenizing effect.

According to the present invention, the uniformity or homogeneity of a substrate crystal can readily be upgraded by carrying out only a heat treatment before a step of ion implanting the crystal and there is thus provided a more homogeneous crystal as a substrte for an integrated circuit.

EXAMPLE

Two wafers (thickness: 450 μm) were cut from an undoped 2" φ GaAs crystal prepared by the LEC method using a PBN crucible. One of the wafers was coated with a protective film of $Si_3N_4$ of 1400 Å in thickness, subjected to a heat treatment at 820° C. for 15 hours, and after removing the coated film, it was subjected to polishing. The other wafer was directly used as "as grown wafer" without this heat treatment, for comparison.

Both the wafers were subjected to Si ion implantation at 180 KV with a dose of $1.5 \times 10^{12}$ cm$^{-2}$ and then to annealing at 820° C. for 20 minutes.

The thus obtained two samples were subjected to measurement of Vth with a pitch of 200 μm to compare the distribution. Consequently, the comparative sample showed a dispersion of threshold voltage σVth=84 mV, while the sample of the present inventions showed σVth=53 mV.

It will clearly be understood from this result that according to the present invention, the dispersion of Vth of the adjacent FET is markedly improved and the distribution of Vth corresponding to the secondary structure of dislocation is decreased, i.e. homogenized by the heat treatment of the present invention.

What is claimed is:

1. A method of upgrading the uniformity of a compound semiconductor crystal, which comprises heat treating a substrate comprising said compound semiconductor crystal, prior to ion implantation of said substrate, in an inert atmosphere at a temperature which is at least as high as the activating temperature after ion implantation.

2. The method of claim 1, wherein the compound semiconductor crystal is selected from the group consisting of gallium arsenide, gallium phosphide, indium phosphide and indium arsenide.

3. The method of claim 1, wherein the inert atmosphere consists essentially of at least one of $N_2$, He, Ar and a mixed gas of 5% $H_2$—$N_2$.

4. The method of claim 1, wherein the heat treatment is carred out at a temperature of 800° to 950° C. for 6 to 24 hours.

5. The method of claim 1, which further comprises subjecting said heat treated substrate to ion implantation, and heat treating said ion implanted substrate for activation.

6. A method of upgrading the uniformity of a compound semiconductor crystal, which comprises forming a protective film on the obverse and reverse surfaces of a substrate comprising said compound semiconductor crystal, heat treating said substrate, prior to ion implantation of said substrate, in an inert atmosphere at a temperature which is at least as high as the activating temperature after ion implantation, and removing said protective film from said surfaces of said heat treated substrate.

7. The method of claim 6, wherein the compound semiconductor crystal is selected from the group consisting of gallium arsenide, gallium phosphide, indium phosphide and indium arsenide.

8. The method of claim 6, wherein the protective film consists of a material selected from the group consisting of silicon nitride, silicon oxide and selenium nitride.

9. The method of claim 6, wherein after removing the protective film, the substrate is further subjected to polishing of the surface.

10. The method of claim 6, wherein the inert atmosphere consists essentially of at least one of $N_2$, He, Ar and a mixed gas of 5% $H_2$—$N_2$.

11. The method of claim 6, wherein the protective film has a thickness of 1100 to 1400 Å.

12. The method of claim 6, wherein the heat treatment is carried out at a temperature of 800° to 950° C. for 6 to 24 hours.

13. The method of claim 6, which further comprises subjecting said substrate to ion implantation after removal of said protective film, and heat treating said ion implanted substrate for activation.

14. The method of claim 9, wherein the surface is polished by a thickness of at least 10 μm.

* * * * *